United States Patent [19]

Lorenz et al.

[11] 4,375,398

[45] Mar. 1, 1983

[54] ELECTRON BEAM SENSITIVE RESIST OF AN ANHYDRIDE COPOLYMER

[75] Inventors: Donald H. Lorenz, Basking Ridge, N.J.; Earl P. Williams, Pen Argyl, Pa.

[73] Assignee: GAF Corporation, New York, N.Y.

[21] Appl. No.: 381,287

[22] Filed: May 24, 1982

Related U.S. Application Data

[63] Continuation-in-part of Ser. No. 357,381, Mar. 12, 1982, abandoned, which is a continuation of Ser. No. 249,991, Apr. 15, 1980, abandoned.

[51] Int. Cl.$^3$ .................. C08F 265/02; C08L 35/08
[52] U.S. Cl. .................. 204/159.15; 525/256; 525/259; 525/285; 204/159.16; 430/296; 430/287
[58] Field of Search .............. 525/256, 259, 285; 204/159.15

[56] References Cited

U.S. PATENT DOCUMENTS 3,475,515 10/1969 Blatz et al. .................. 525/285
3,703,402 11/1972 Cole .................. 204/159.15
3,857,822 12/1974 Frass .................. 525/285
4,001,016 1/1977 Rosenkranz et al. .................. 96/35.1

*Primary Examiner*—Carman J. Seccuro
*Attorney, Agent, or Firm*—J. Magee, Jr.; J. Gary Mohr

[57] ABSTRACT

This invention describes an ionizing radiation sensitive material having high contrast, high sensitivity and comprised of a mixed half-ester or half amide of the reaction of an N-hydroxy or N-aminoalkyl amide and a hydroxy alkyl terminally unsaturated compound with an alkylvinyl ether-maleic anhydride copolymer. A typical material is made by reacting hydroxyethyl pyrrolidone and hydroxyethyl acrylate with octadecylvinyl ether-maleic anhydride copolymer.

32 Claims, No Drawings

ELECTRON BEAM SENSITIVE RESIST OF AN ANHYDRIDE COPOLYMER

This application is a continuation-in-part of Ser. No. 357.381, filed Mar. 12, 1982, which in turn is a continuation of Ser. No. 249,991, filed Apr. 15, 1980, both now abandoned.

BACKGROUND OF THE INVENTION

1. Field of the Invention

This invention relates to ionizing radiation sensitive materials which are useful as electron beam resists and information recording media.

2. Description of the Prior Art

It is well-known that electron beam irradiation will cause crosslinking of certain polymers. An article by Herbert S. Cole et al entitled "Electron Sensitive Resists Derived from Vinylether-Maleic Anhydride Copolymers" in the IEEE Transactions on Electron Devices, July, 1975, p. 417–420 and U.S. Pat. No. 3,703,402 describes a series of such materials made of octadecylvinyl ether and maleic anhydride copolymer half esterified with, among other allyl or propargyl alcohol or hydroxyalkyl acrylate. The authors state that the most efficient radiation induced crosslinking reactions are activated through the presence of an unsaturated terminal group in the resist, and, accordingly, there is a direct association between increased sensitivity and terminal unsaturation. Their experimental results indicated that reduction or elimination of terminal unsaturation caused a drastic decrease in the sensitivity of the resist polymer, and that to require a radiation dose no greater than $5 \times 10^{-7}$ C/cm$^2$ an unsaturated half ester is required and that the unsaturation must be terminal unsaturation.

In the present invention, contrary to the teaching of Cole, it has been discovered that resist compositions equally as sensitive can be obtained with a copolymer that has the terminal unsaturation drastically reduced. Even more significantly, it has been found that the contrast of such resists improves appreciably, which feature provides a resolution capability of less than 0.5 micrometer. This increased contrast is achieved herein with resists made by reacting an alkylvinyl ether-maleic anhydride copolymer with a hydroxyalkyl acrylate such as hydroxyethyl acrylate, hydroxyethyl methacrylate, 3-hydroxypropyl acrylate, 3-hydroxypropylmethacrylate, 4-hydroxybutyl acrylate, 4-hydroxybutyl methacrylate or allyl or propargyl alcohol or pentaerythritol triacrylate and an N-hydroxyalkyl amide or an N-aminoalkyl amide to form the novel half-ester copolymer.

SUMMARY OF THE INVENTION

The present invention is concerned with a very high contrast electron beam resist which is a copolymer material comprising the mixed half-ester of half amide product of the reaction of an N-hydroxy or N-aminoalkyl amide and a hydroxyalkyl acrylate with an alkylvinyl ether-maleic anhydride copolymer. In the preferred form of the invention, an N-hydroxyalkyl cyclic amide, such as hydroxyethyl pyrrolidone, and a hydroxyalkyl acrylate, such as hydroxyethyl acrylate, are reacted with a long chain alkylvinyl ether-maleic anhydride copolymer, preferably having about 10–20 carbon atoms in the alkyl chain, such as octadecylvinyl ether-maleic anhydride copolymer. The hydroxyethyl pyrrolidone and hydroxyethyl acrylate are preferably charged in a 40:60 molar ratio which yields a resist copolymer containing approximately half of the anhydride groups unreacted and approximately half of the anhydride groups reacted to half esters said esterifying groups being in a one to one ratio of hydroxyethyl pyrrolidone to hydroxyethyl acrylate. The product which is soluble in common solvents such as toluene readily forms smooth films on a substrate.

Upon irradiation with an electron beam, the resists of the invention crosslink at a low electron density to form an insoluble polymer (a negative resist) which is adherent to the substrate, is non-tacky and easily handled. The unexposed resist can be washed off readily to form the desired resist pattern.

DETAILED DESCRIPTION OF THE INVENTION

The electron beam sensitive materials of the invention are characterized by the following: (1) high sensitivity to electron beam irradiation; (2) insensitivity to visible light or near ultraviolet irradiation; (3) ease of forming smooth films on substrates; (4) resistance of the crosslinked polymer to wet or dry etch; (5) an ability of the material to be washed away readily in the unexposed areas with conventional solvents; (6) formation of a negative resist pattern; (7) superb contrast and resolution capabilities; (8) thermal stability; (9) good shelf life; (10) minimal dark reaction after exposure.

These advantageous properties of the materials of the invention are achieved herein unexpectedly as they contain a lesser amount, approximately 26%, of terminal unsaturation in the ester groups as compared to resists shown in the prior art. The mechanism by which the resists of the invention provide these advantageous properties and characteristics is unknown at present. However, it is believed that the amide and acrylate groups may form a charge transfer complex which lowers the energy required for the acrylate groups to crosslink with adjacent chains. This explanation is supported by the experimental evidence that increased sensitivity is achieved at a molar ratio of amide to acrylate which approaches 1:1, which would be the optimum ratio for formation of such a charge transfer complex.

One embodiment of the material of the invention is prepared by esterifying the alkylvinyl ether-maleic anhydride copolymer with a mixture of the N-hydroxyalkyl amide and the hydroxyalkyl acrylate compounds to form the desired mixed half-ester copolymer. Then a thin film of the polymer is applied to a suitable substrate, such as chrome plated glass or quartz mask substrate, silicon wafer or a conductive polyester substrate, and exposed at various charge densities.

The hydroxyalkyl amide component is either an N-hydroxyalkyl cyclic amide, such as hydroxyalkyl pyrrolidone, e.g. hydroxyethyl pyrrolidone, hydroxypropyl pyrrolidone, hydroxybutyl pyrrolidone, hydroxyethyl-l-caprolactam, hydroxypropyl-l-caprolactam, hydroxybutyl-l-caprolactam and the like; or an N-hydroxyalkyl linear amide, such as N-hydroxyethyl acetamide, N-hydroxyethyl propionamide, and the like.

The terminally unsaturated component includes such compounds as allyl or propargyl alcohol and hydroxyalkyl acrylate, e.g. hydroxyethyl acrylate, or methacrylate, 3-hydroxypropyl acrylate or methacrylate, 4-hydroxybutyl acrylate or methacrylate or pentaerythritol triacrylate and the like.

Another embodiment of the material of the invention is prepared by reacting the alkylvinyl ether-maleic anhydride copolymer with a mixture of the N-aminoalkyl amide and the hydroxy alkyl acrylate compounds to form the desired mixed half-amide/ester copolymer. Then a thin film of the polymer is applied to a suitable substrate, such as chrome plated glass or quartz mask substrate, silicon wafer or a conductive polyester substrate, and exposed at various charge densities.

The aminoalkyl amide component is either an N-aminoalkyl cyclic amide, such as aminoalkyl pyrrolidone, e.g. aminoethyl pyrrolidone, aminopropyl pyrrolidone, aminobutyl pyrrolidone, aminoethyl-l-caprolactam, aminopropyl-l-caprolactam, aminobutyl-l-caprolactam and the like; or an N-aminoalkyl linear amide, such as N-aminoethyl acetamide, N-aminoethyl propionamide, and the like.

EXAMPLE 1

Preparation of a Mixed Half-ester of Octadecylvinyl Ether-Maleic Anhydride Copolymer using a charge of 40 Mole Percent Hydroxyethyl Pyrrolidone, 60 mole Percent Hydroxyethyl Acrylate.

A mixture of a 40% solution of octadecylvinyl ether-maleic anhydride copolymer (296 g., 0.3 mole) in toluene, hydroxyethyl pyrrolidone (15.4 g., 0.12 mole) and hydroxyethyl acrylate (20.9 g., 0.18 mole) is heated at 80° C. for 23 hours. The resultant mixed half-ester is precipitated in methanol and dried under vacuum to produce 135 g. of product. The relative viscosity of a 1% solution of the mixed half-ester in butyl acetate is 1.05.

EXAMPLE 2

Sensitivity of Resists Under Electron Beam Irradiation

Samples were prepared in like manner as Example 1, but with different ratios of alcohols. They were then spin coated on chromed glass plates from toluene and dried. This left a thin film of the copolymer on the chrome. The coated plates were exposed to 15 kV electrons in a suitable device, the dose being varied over the plate through a range of $10^{-7}$–$10^{-5}$ C/cm$^2$. Exposure was adjusted to yield a pattern of 64 small squares, each receiving a different dose within this range. After exposure, plates were developed in a 1:1 (w/w) mixture of methylene chloride and isopropyl alcohol and dried. The thickness of the remaining resist was measured with a profilometer. A curve was constructed relating log (dose) to normalized thickness, where normalized thickness is the ratio of actual thickness over original thickness. The dose required for a normalized thickness of 0.5 is defined as sensitivity and the slope of the straight line portion of the curve defines its contrast.

Copolymers prepared using various esterifying alcohols were examined as described above with the following results.

| Esterifying Alcohol or Ratio of Mixed Alcohols | Sensitivity (C/cm$^2$ × 10$^6$) | Contrast ($\alpha$) |
| --- | --- | --- |
| 50 HEA | 0.832 | 1.57 |
| 10 HEP/40 HEA | 0.725 | 1.73 |
| 17.5 HEP/32.5 HEA | 0.752 | 1.87 |
| 20 HEP/30 HEA | 1.175 | 2.02 |
| 25 HEP/25 HEA | 0.970 | 1.97 |
| 40 HEP/10 HEA | 2.542 | 1.95 |
| 50 HEMA | 1.654 | 1.94 |
| 25 HEP/25 HEMA | 1.740 | 2.05 |
| 50 Allyl | 1.240 | 1.60 |
| 25 HEP/25 Allyl | 1.923 | 1.87 |

HEP is hydroxyethyl pyrrolidone
HEA is hydroxyethyl acrylate
HEMA is hydroxyethyl methacrylate

EXAMPLE 3

The electron sensitive material prepared as shown in Example 1, was spin coated from toluene on chromed glass and dried. The resultant film on chrome glass was exposed to a test pattern in a Varian Ee$^-$ BES-40A electron beam lithographic system. After exposure and development with methyl ethyl ketone the resulting pattern was evaluated for sensitivity, contrast, resolution and etch resistance. The results, also compared to those determined with two commercial resists, are shown below:

| | PERFORMANCE | | |
| --- | --- | --- | --- |
| | EXAMPLE 1 MATERIAL | COP | SEL-N |
| Sensitivity C/cm$^2$ × 10$^6$ @ 10 kV | 0.38 | 0.27 | 0.69 |
| Resolution (micrometer) | 0.5 | 1.0 | 0.5 |
| Contrast ($\gamma$) | 1.6–1.8 | 0.95 | 0.99 |
| PlasmaEtch Resistance A/Min. | 65.5 | — | 68 |
| Reactivity ion beam Selectivity* | 1.00 | 0.61 | 0.67 |
| Dark Reaction | None | 30 Min. | 30 Min. |

*ratio of etch rate of polymer/etch rate of SiO$^2$

EXAMPLE 4

Three mixtures of a 40% solution of octadecylvinyl ether-maleic anhydride copolymer (296 g., 0.3 mole) in toluene, hydroxyethyl pyrrolidone (15.4 g., 0.12 mole) and hydroxyethyl acrylate (20.9 g., 0.18 mole) were heated at 60°, 80° and 105° C. respectively for 23 hours. The resultant mixed half-ester products were precipitated in methanol and dried under vacuum. After coating as outlined in example 2 and then exposing said coatings to 20 kV electrons the following resulted.

| TEMP | SENSITIVITY C/cm$^2$ × 10$^6$ | CONTRAST | HEP | HEA (Mole percent HEP/HEA in Resist Material) |
| --- | --- | --- | --- | --- |
| 60° C. | 2.00 | 2.06 | 1.72 | 10.2 |
| 80° C. | 1.37 | 1.90 | 25.6 | 26.0 |
| 105° C. | 1.22 | 1.60 | 27.4 | 34.3 |

EXAMPLE 5

Preparation of a mixed half ester of octadecene-1-maleic anhydride copolymer using a charge of 50 mole percent hydroxyethyl pyrrolidone and 50 mole percent hydroxyethyl acrylate.

A mixture of a 29.5% solution of octadecene-1-maleic anhydride copolymer (37.2 g., 0.1 mole) in xylene, hydroxyethyl pyrrolidone (6.5 g., 0.05 mole) and hydroxyethyl acrylate (5.0 g., 0.05 mole) is heated at 75° to 80° for 23 hours. The resultant mixed half ester is precipitated in methanol and dried under vacuum to produce 40.0 g. of product. The relation viscosity of a 1% solution of the mixed half ester in butyl acetate is 1.10.

The electron sensitive material prepared in accordance to the above was spin coated from toluene solution onto a chrome glass plate and dried. The resist film was exposed to a test pattern using 10 kV electrons in a Varian Ee− BES-40A electron beam lithographic device. The exposed plate was developed in methyl ethyl ketone and the sensitivity, contrast and resolution were evaluated from measurements made on the pattern in the cross-linked resist. The results indicated that the above material is a high sensitivity resist, $1.0 \times 10^{-7}$ $C/cm^2$, with a contrast of 0.9 and a resolution capability of 1.0 micrometer.

While the invention has been described with reference to certain embodiments, it will be understood that changes and modifications may be made which are within the skill of the art. Accordingly, it is intended to be bound only by the appending claims.

What is claimed is:

1. A high sensitivity electron beam resist polymer which is the mixed half-ester reaction product of a reaction between an alkyl vinyl ether-maleic anhydride copolymer with a terminally unsaturated alcohol and a compound selected from the group consisting of N-hydroxyalkyl amides and N-aminoalkyl amides.

2. A high sensitivity electron beam resist polymer comprising the mixed half-ester product of the reaction of an N-hydroxyalkyl amide and a terminally unsaturated alcohol with an alkyl vinyl ether-maleic anhydride copolymer.

3. A resist according to claim 2 in which said N-hydroxyalkyl amide is an N-hydroxyalkyl cyclic amide.

4. A resist according to claim 3 in which said amide is a hydroxyalkyl pyrrolidone.

5. A resist according to claim 3 in which said amide is a hydroxyalkyl-l-caprolactam.

6. A resist according to claim 3 in which said amide is hydroxyethyl pyrrolidone, hydroxypropyl pyrrolidone, hydroxybutylpyrrolidone, hydroxethyl-l-caprolactam, hydroxypropyl-l-caprolactam or hydroxybutyl-l-caprolactam.

7. A resist according to claim 2 in which said N-hydroxyalkyl amide is an N-hydroxyalkyl linear amide.

8. A resist according to claim 7 in which said amide is N-hydroxyethyl acetamide, or N-hydroxyethyl propionamide.

9. A resist according to claim 2 in which said terminally unsaturated alcohol is hydroxyethyl acrylate, hydroxyethyl methacrylate, 3-hydroxypropyl acrylate, 3-hydroxypropylmethacrylate, 4-hydroxybutyl acrylate or 4-hydroxybutyl methacrylate.

10. A resist according to claim 2 in which said hydroxyalkyl amide and terminally unsaturated alcohol compounds are present in a molar ratio of about 40:60 to 60:40 to one another in said polymer.

11. A resist according to claim 2 in which said hydroxyalkyl amide and terminally unsaturated alcohol compounds are present in a molar ratio of about 10:90 to 90:10 to one another in said polymer.

12. A resist according to claim 2 in which said hydroxyalkyl amide and terminally unsaturated alcohol compounds are present in a molar ratio of about 50:50 to one another in said polymer.

13. A high sensitivity electron beam resist polymer comprising the mixed half-ester product of the reaction of an N-aminoalkyl amide and a terminally unsaturated alcohol with an alkyl vinyl ether-maleic anhydride copolymer.

14. A resist according to claim 13 in which said N-aminoalkyl amide is an N-aminoalkyl cyclic amide.

15. A resist according to claim 14 in which said amide is a aminoalkyl pyrrolidone.

16. A resist according to claim 14 in which said amide is a aminoalkyl-l-caprolactam.

17. A resist according to claim 14 in which said amide is aminoethyl pyrrolidone, aminopropyl pyrrolidone, aminobutylpyrrolidone, aminoethyl-l-caprolactam, aminopropyl-l-caprolactam or aminobutyl-l-caprolactam.

18. A resist according to claim 14 in which said N-aminoalkyl amide is an N-aminoalkyl linear amide.

19. A resist according to claim 18 in which said amide is, N-aminoethyl acetamide, or N-aminoethyl propionamide.

20. A resist according to claim 13 in which said terminally unsaturated alcohol is hydroxyethyl acrylate, hydroxyethyl methacrylate, 3-hydroxypropyl acrylate, 3-hydroxypropylmethacrylate, 4-hydroxybutyl acrylate or 4-hydroxybutyl methacrylate.

21. A resist according to claim 13 in which said aminoalkyl amide and terminally unsaturated alcohol compounds are present in a molar ratio of about 40:60 to 60:40 to one another in said polymer.

22. A resist according to claim 13 in which said aminoalkyl amide and terminally unsaturated alcohol compounds are present in a molar ratio of about 10:90 to 90:10 to one another in said polymer.

23. A resist according to claim 13 in which said aminoalkyl amide and terminally unsaturated alcohol compounds are present in a molar ratio of about 50:50 to one another in said polymer.

24. A resist according to claim 2 in which the alkyl group of said alkylvinyl ether-maleic anhydride copolymer is a long chain alkyl group.

25. A resist according to claim 24 in which said alkyl group has about 10–20 carbon atoms.

26. A resist according to claim 24 in which said alkyl group is octadecyl.

27. A high sensitivity electron beam resist according to claim 1 which said polymer material comprises the mixed half-ester product of the reaction of about 40–60 mole percent of hydroxyethyl pyrrolidone and about 60–40 mole percent of hydroxyethyl acrylate with octadecylvinyl ether-maleic anhydride copolymer.

28. A resist according to claim 27 which comprises about 50 mole percent each of said hydroxyethyl pyrrolidone and said hydroxyethyl acrylate.

29. A crosslinked negative resist polymer product formed by irradiation of any of the resists of claims 1–28 with an electron beam.

30. An information recording material sensitive to ionizing radiation exposure comprising a copolymer of maleic anhydride and a vinyl monomer, the maleic anhydride being reacted with a mixture of terminally unsaturated alcohol compound and an N-hydroxyalkyl amide.

31. A resist according to claim 2 which said terminally unsaturated alcohol is allyl, propargyl or penta erythritol triacrylate.

32. An information recording material sensitive to ionizing radiation exposure comprising a copolymer of maleic anhydride and a vinyl monomer, the maleic anhydride being reacted with a mixture of terminally unsaturated alcohol compound and an N-aminoalkyl amide.

* * * * *